United States Patent [19]

Hornak

[11] 4,152,606
[45] May 1, 1979

[54] WAVEFORM CAPTURE DEVICE

[75] Inventor: Thomas Hornak, Los Altos, Calif.

[73] Assignee: Hewlett-Packard Company, Palo Alto, Calif.

[21] Appl. No.: 834,011

[22] Filed: Sep. 16, 1977

[51] Int. Cl.² .................... G11C 27/02; G11C 19/28
[52] U.S. Cl. ............................ 307/221 D; 307/353; 357/24
[58] Field of Search ............... 307/221 D, 352, 353; 328/151; 357/24

[56] References Cited
U.S. PATENT DOCUMENTS
3,781,574  12/1973  White et al. .................. 307/221 D Primary Examiner—John Zazworsky
Attorney, Agent, or Firm—Ronald E. Grubman

[57] ABSTRACT

A transient storage instrument of the charge coupled device (CCD) type captures fast analog transient signals and reproduces them at a slower rate. A number of stages of a "sampling" CCD sample and store charges representing time sampled voltages on the transient signal. The stored charges are then transferred in parallel into a "storage" CCD shift register to be stored and serially outputted as a time sequence of output voltage levels representative of the input signal at each of the sample times.

3 Claims, 6 Drawing Figures

WAVEFORM CAPTURE DEVICE

BACKGROUND OF THE INVENTION

In various applications it is required to store, digitize and/or display fast transient electronic signals. One example is found in storage-type oscilloscopes which store and display transient signals by depositing a trace of charge on a mesh in a cathode ray tube; the charged mesh is then used to modulate a flood of electrons impinging onto the CRT screen. Another example of importance in signal analysis systems is the conversion of analog signals to digital representations, which can then be stored and manipulated by conventional digital processing. Typically the analog signal is converted to a digital equivalent by means of conventional analog-to-digital (A/D) converters. This approach is costly when wide bandwidth analog signals are to be processed.

Another device for storing analog signals is known in which the samples of the analog signal are gated onto a number of storage capacitors, and subsequently gated out from the storage capacitors to provide a desired output signal representative of the input signal. A difficulty with this prior art device is that all of the storage capacitors are connected to a common output line, which itself has a large distributed capacitance. Thus, when the charge from any particular storage capacitor is dumped onto the common output line, the resulting output voltage is significantly diminished from the original input voltage which charged that capacitor. The system signal-to-noise ratio is thereby degraded. To overcome this problem, it would be necessary to increase the capacitance of the storage capacitors relative to the distributed capacitance of the output line. This solution is not acceptable for high-speed devices, since the maximum possible write-in speed would then be limited by the large time constant of the signal source output resistance and the individual storage capacitors.

SUMMARY OF THE INVENTION

In accordance with the illustrated preferred embodiments the present invention provides a charged coupled device (CCD) capable of capturing fast transient signals and reproducing those signals at a much slower rate. The device samples an analog transient signal at a succession of sample times and stores a charge proportional to each of the sampled voltages in an associated "sampling" CCD stage. Charge samples are not exposed to repetitive transfers during this high speed write-in procedure. After all of the sampled charges are stored in the sampling CCD stages, they are shifted in parallel into the storage cells of a "storage" CCD serial shift register. This transfer may be accomplished at low speed to minimize charge loss during transfer. Finally, the charges are serially shifted through the CCD serial shift register for read-out. This read-out shift is again performed at low speed to maximize charge transfer and minimize concomitant signal degradation, and to allow digitization, if desired, at low speed using low cost A/D converters.

A device according to the present invention is especially useful when high-speed sampling is required, since there is no speed-limiting distributed capacitance as is present in the capacitor-based devices described in the Background. Thus, sampling rates as high as 100 million samples per second have been achieved with devices according to the present invention.

DETAILED DESCRIPTION OF THE INVENTION

Figure 1:
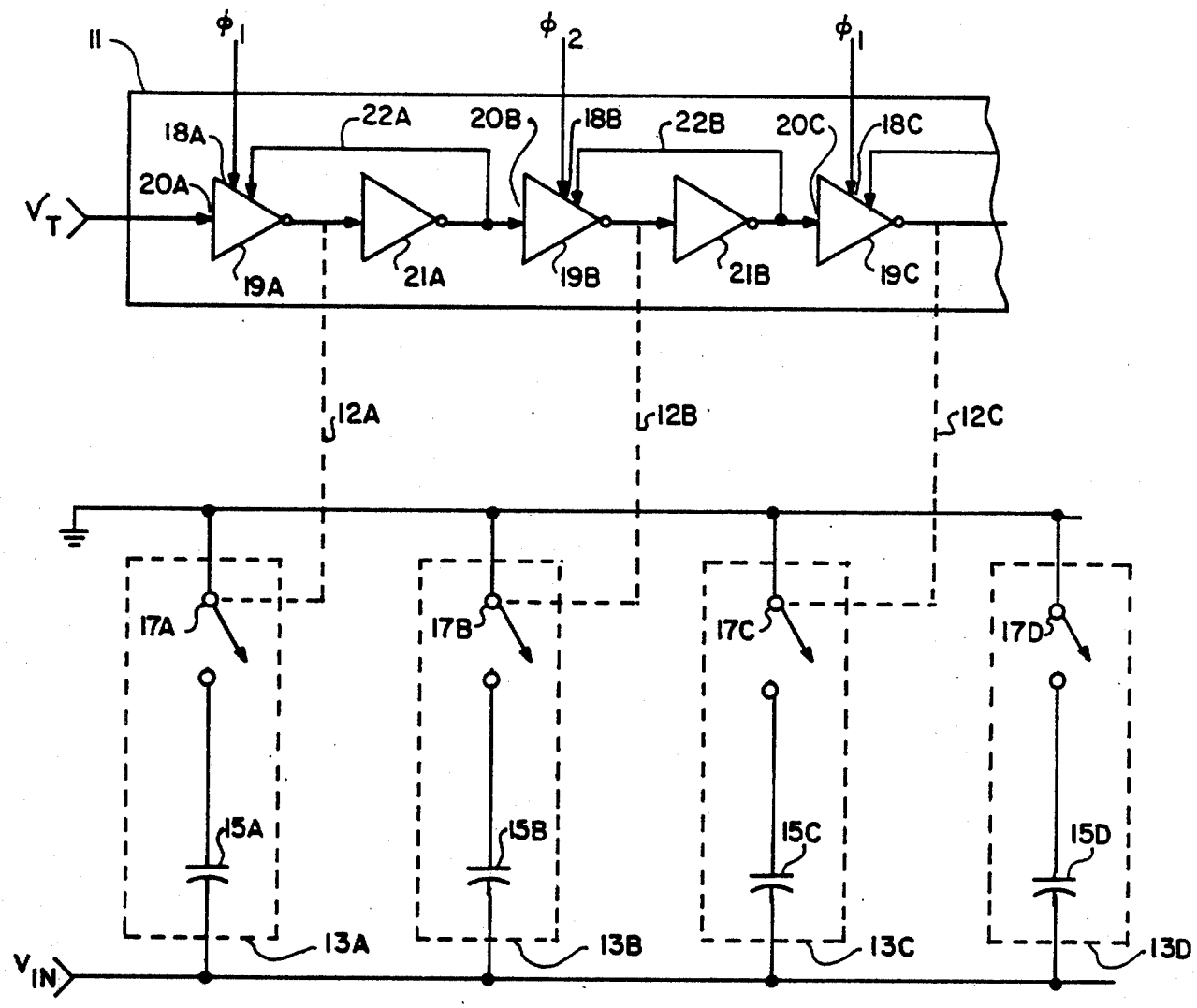
FIG. 1 is a schematic representation of the input section of a waveform capture device.

FIG. 1 illustrates some basic operational interactions between several elements of a device according to the invention. A clocked ripple chain (CRC) 11 generates a series of timing signals 12A–12C which are sent to a set of stages 13A–13D of a "sampling" charge coupled device (CCD). For purposes of illustrating operation of the invention these are shown schematically as a chain of capacitors 15A–15D, each having one terminal connected to a corresponding switch, labeled 17A–17D. The second terminal of each capacitor 15A–15D is connected in common with the second terminal of each other capacitor, and also to the source of a transient signal $V_{IN}$ to be captured.

Figure 2:
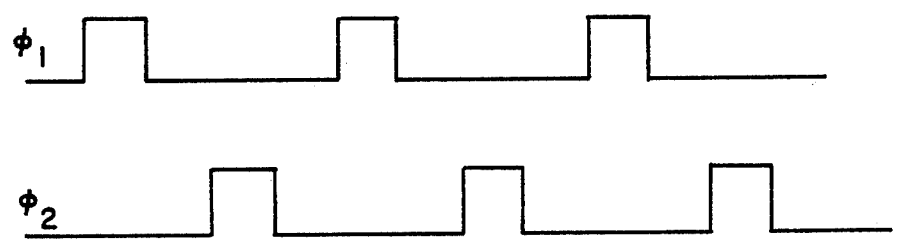
FIG. 2 is a timing diagram of two pulse chains which govern the sampling of a waveform to be captured.

In operation, switches 17A–17D are sequentially activated by timing signals generated by CRC 11 which in FIG. 1 is represented schematically by a first chain of inverting amplifiers 19A, 19B, 19C interleaved with a second chain of inverters 21A, 21B etc. Odd ones of inverters 19 are controlled by the leading edges of pulses in a pulse train $\phi_1$ while even ones of inverters 19 are controlled by pulses of a pulse train $\phi_2$. Pulse trains $\phi_1$ and $\phi_2$ are shown in FIG. 2 as two non-overlapping pulse trains of like period, which in practice is in the range 20 ns to 20 $\mu$s. In operation, the application of a positive going edge of pulse $\phi_1$ or $\phi_2$ to a control input 18 of any inverter 19 causes that inverter's output to go "low" if a "high" signal is present at its enabling input 20. Thus, an enabling voltage $V_T$ applied at input 20A of inverter 19A will initiate (upon the subsequent leading edge of $\phi_1$) a ripple chain of high-low signals down the line of inverters 19, each inverter producing an output transition one propagation delay time after the leading edge of pulse train $\phi_1$ or $\phi_2$ appears at its control input. Inverters 21 invert the high-low transitions at the output of each inverter 19 into a low-high transition, thus enabling the subsequent inverter 19 to respond to the subsequent leading edge in pulse train $\phi_1$ or $\phi_2$. The timing is stabilized by locking to the $\phi_1$, $\phi_2$ frequency; i.e. odd ones of inverters 19 are driven to output transitions only as a response to a low-high transition of pulses in pulse chain $\phi_1$, while even ones of inverters 19 will output transitions only when driven by low-high transitions of pulses in pulse train $\phi_2$. Thus, the high to low output transitions of each of inverters 19 is assured to occur at precisely the period of the pulses $\phi_1$ and $\phi_2$. This continual synchronization eliminates cumulative errors which might otherwise result from nonuniform propagation delays in the inverters due to variations in wafer doping or oxide thickness of the integrated circuit chip on which the CRC would be fabricated in practical devices. Positive feedback connections 22 from the output of each inverter 21 to an auxiliary input of its preceding inverter 19 ensures that the output of each inverter 19 remains in a low state after each high-to-low transition regardless of the low state between the pulses in pulse trains $\phi_1$ and $\phi_2$. A common input (not shown in FIG. 1) to all inverters 19 and 21 may be used to return all inverter 19 outputs to a "high" state thereby resetting CRC 11 into its initial state.

Referring now to sampling CCD stages 13, a high-to-low signal transition applied to any of switches 17 is taken as opening the switch governed by that signal. Prior to the application of enabling signal $V_T$ to CRC 11 all switches 17 are closed and all capacitors 15 are simultaneously tracking input voltage $V_{IN}$. After enabling pulse $V_T$ goes high and enables inverter 19A, the latter will output a high-low transition responsive to the leading edge of the first $\phi_1$ pulse. Switch 17A will then open, leaving capacitor 15A charged to a value proportional to the value of $V_{IN}$ at the time of the opening of switch 17A. All other capacitors 15 continue to track $V_{IN}$. Inverter 21A now applies a high enabling signal to inverter 19B. The next leading edge of $\phi_2$ controls inverter 19B to output a high-low transition which in turn opens switch 17B to sample the waveform $V_{IN}$ at the later time. In a similar manner, the enabling signal 15 sequentially samples input signal $V_{IN}$ at a sequence of times synchronized to the period of the $\phi_1$ and $\phi_2$ pulse trains.

Figure 3:
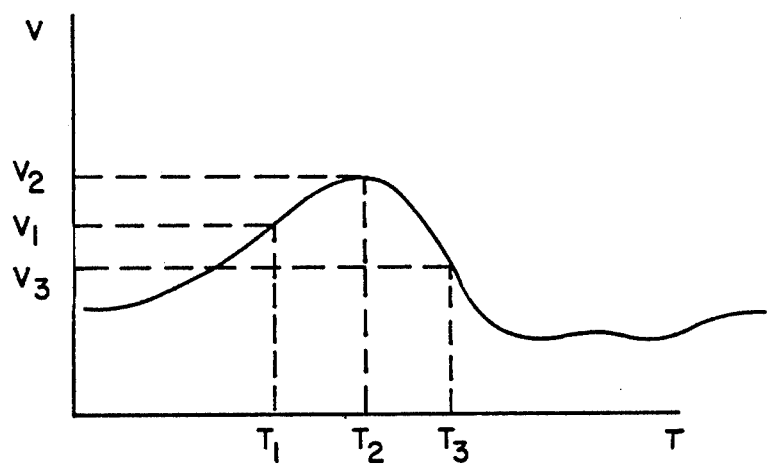
FIG. 3 shows a waveform to be captured and some representative points sampled on the waveform.

When all switches 17 have opened, all of the capacitors 15 (representing storage gates of the set of sampling CCD stages 13) will have gone from a track condition to a hold condition, thereby storing charges representing a "snapshot" of transient signal $V_{IN}$ in sampling CCD stages 13. FIG. 3 illustrates a typical voltage $V_{IN}$ and sampling times $T_1$, $T_2$ and $T_3$ producing sampled voltages $V_1$, $V_2$ and $V_3$ stored as charges on the first three sampling CCD stages 13A-13C.

Figure 4A:
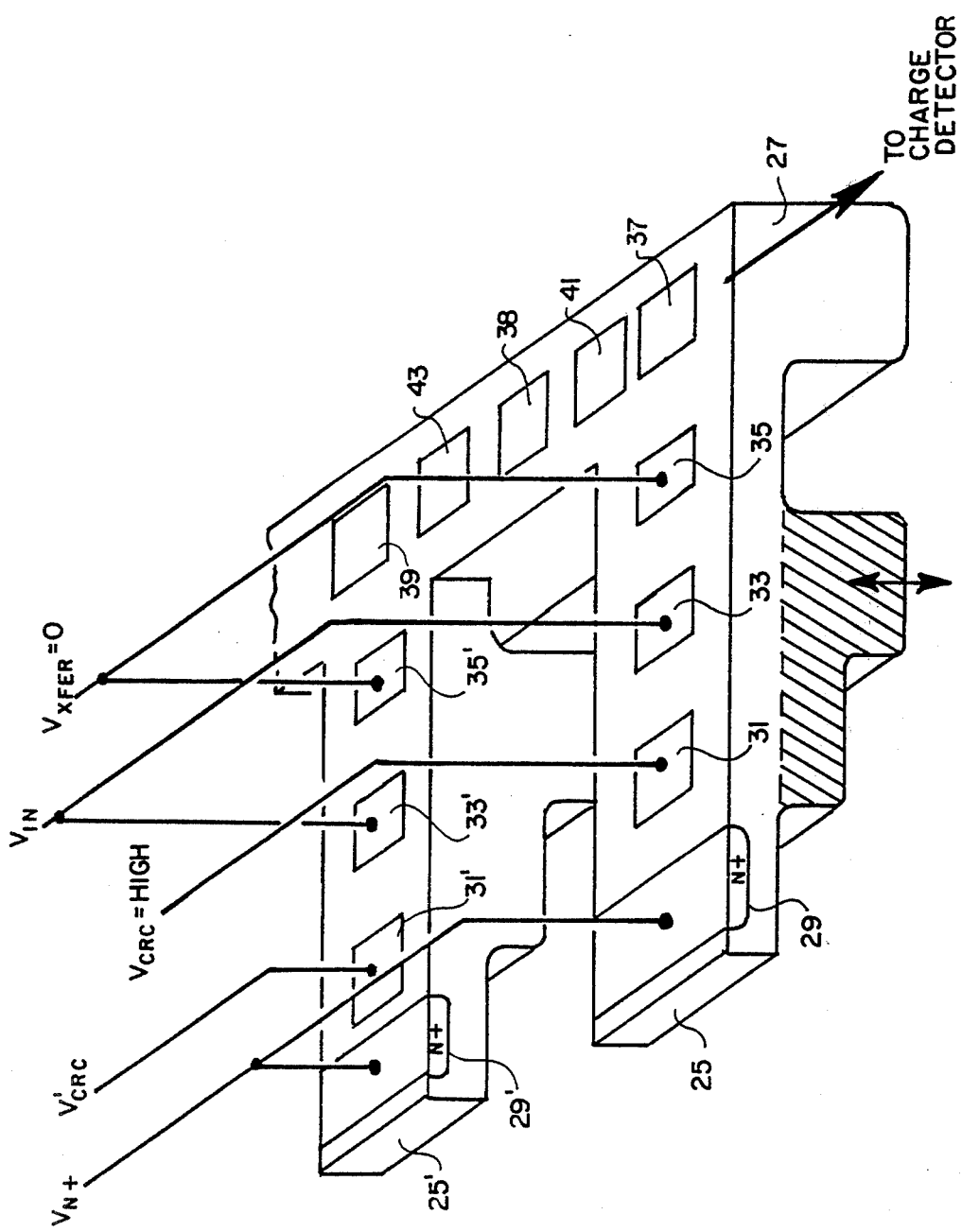
FIGS. 4A–4C show several sampling CCD stages and a storage CCD shift register configured to sample and hold the waveform to be captured.
Figure 4B:
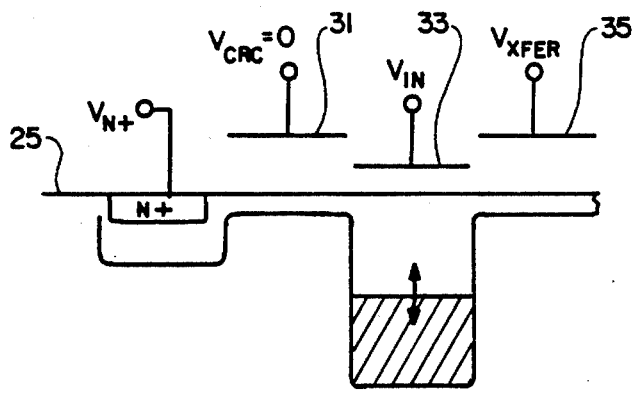
Figure 4C:
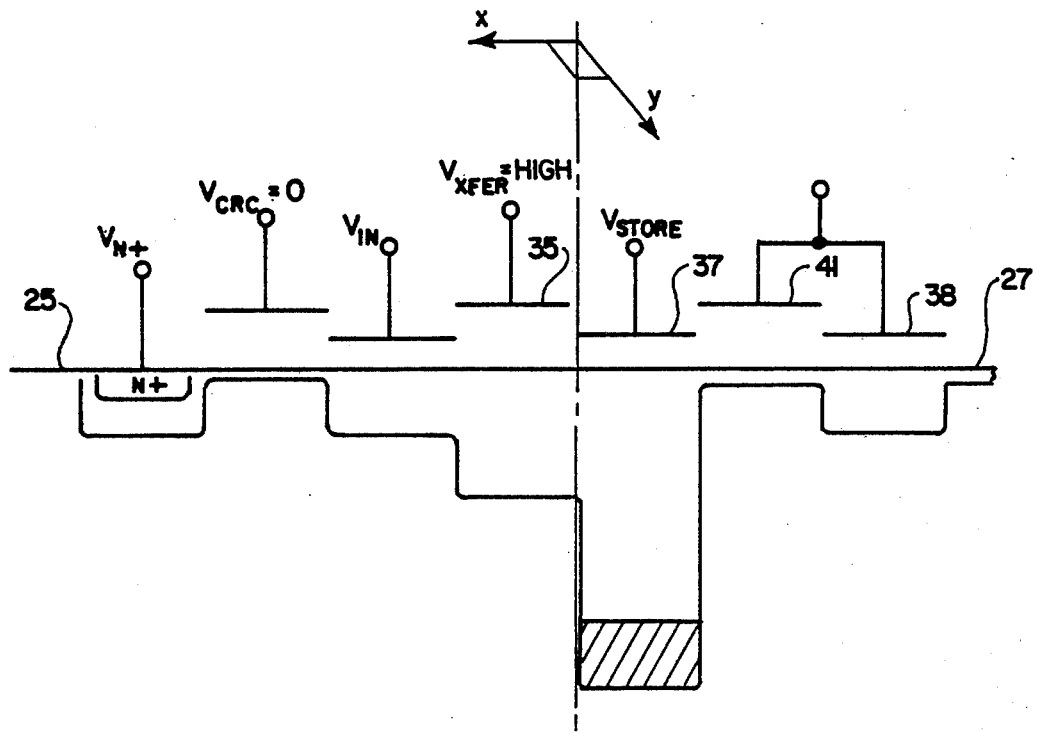

Operation of the invention can be further understood by referring now to FIGS. 4A-4C. FIG. 4A schematically illustrates several representative sampling CCD stages 25 and 25' serving as parallel inputs to a storage CCD shift register 27. (Sampling CCD stages 25 and 25' are preferred CCD embodiments according to the invention of the sampling CCD stage represented schematically by two of the elements 13 of FIG. 1). In FIG. 4 the vertical dimension represents the electrical potential appearing at the oxide semiconductor interface of the CCD stages. The physical arrangement of storage CCD 27 with respect to sampling CCD stage 25 is indicated by the orthogonal axes labeled x and y in FIG. 4C. The stages 25 and 25' and the stages of CCD 27 can be fabricated using conventional semiconductor technology now well known in the CCD art; in the discussion which follows a P-type substrate is assumed for all CCD's.

Considering the structure in FIG. 4A in more detail sampling CCD stage 25 includes an N+ diffusion region 29 grounded with respect to AC current and biased by a voltage $V_{N+}$ to reverse-bias the PN+ junction between N+ region 29 and the P-type substrate. N+ region 29 will act as a source or sink of minority carriers in CCD stage 25. In practice, a single N+ diffusion region may be used as an electron source for all sampling CCD stages 25, 25' etc. A timing gate 31, typically metallic, is connected to the output of one of the inverters 19 (shown in FIG. 1), this output being designated in FIGS. 4A-4C as a voltage $V_{CRC}$. Adjacent timing gate 31 is a sampling gate 33 (for clarity, FIG. 4A shows diffusion 29 and gates 31, 33 et seq. as having gaps between them. In practice adjacent gates and diffusions overlap, as is known in the CCD art).

When $V_{CRC}$ is high a depletion channel is formed under gate 31 which allows electrons to flow into a depletion region under a sampling gate 33. Sampling gate 33 is itself electrically connected to the input voltage $V_{IN}$ to be sampled, so that an electrical potential "well" is formed under sampling gate 33 whose depth is at all times responsive to the voltage level of $V_{IN}$. (In terms of the simplified representation of FIG. 1, gate 31 corresponds to one of the switches 17, while the depletion region below sampling gate 33 corresponds to the associated capacitor 15). Hence, whenever there is a depletion channel existing under gate 31 the number of electrons under sampling gate 33 will be proportional to the value of $V_{IN}$ at every instant of time.

In FIG. 4B voltage $V_{CRC}$ on gate 31 is shown as having gone low subsequent to a high-to-low transition of the output of the associated inverter 19 of CRC 11. At this time the depletion channel under gate 31 collapses, trapping the charge which is currently under sampling gate 33 and preventing any further charge from flowing into or out of the potential well under gate 33, even though the voltage of gate 33 continues to follow voltage $V_{IN}$. In effect the potential well under gate 33 has gone from a track to a hold condition.

As was discussed above in connection with FIG. 1 all of the other sampling CCD stages (25' etc.) also track $V_{IN}$ continuously, each one going into a hold mode in response to a signal $V_{CRC}$ from CRC 11 of FIG. 1. After all sampling CCD stages have sequentially gone from a track to a hold condition, a representation of transient signal $V_{IN}$ will have been stored under sampling gates 33, 33' etc. of the sampling CCD stages. In FIG. 4C all sampling CCD stages have gone from track to hold conditions, at which time a transfer voltage $V_{XFER}$ goes high, thereby forming a depletion region under a transfer gate 35 of sampling CCD stage 25, and under a corresponding transfer gate in each of the other sampling CCD stages. At this time $V_{IN}$ is clamped to zero voltage forcing the charge which was trapped in the well under gate 33 to be transferred into the (now deeper) well under transfer gate 35. Another voltage $V_{STORE}$ applied to a gate 37 of storage CCD 27 also goes high so that the charge flowing under transfer gate 35 will be transferred into a deeper well under gate 37 in storage CCD 27. This same operation is performed simultaneously with respect to sampling CCD stage 25' and each of the other sampling CCD stages. Thus, e.g., the charge which was stored under gate 33' in sampling CCD stage 25' is transferred into a potential well under gate 39 of storage CCD 27.

At this point there is stored in storage CCD 27 a sequence of charge packets representing samples of the waveform $V_{IN}$ at a sequence of sample times; in effect, a "snapshot" of $V_{IN}$ is now stored in storage CCD 27. Storage CCD 27 also includes interleaving storage gates such as the gate labeled 38 and transfer gates 41 and 43 to form a serial shift register structure. Readout of the trapped transient waveform may now be simply performed by pulsing voltages on the gates of storage CCD 27 in a conventional manner to serially transfer each of the charges at low speed down the CCD. The charges may then be detected in any conventional manner as is known in the art.

What has been accomplished is that the input signal $V_{IN}$ has been sampled at high speed (up to about 100 MHz, as determined by the repetition rates of pulse trains $\phi_1$, and $\phi_2$) but stored for readout at low speed (typically about 100 KHz suitable to the charge transfer properties of long CCD 27). Thus, the high frequency sampled waveform may now be digitally processed as it exits at low speed from the output of CCD 27. A device according to this invention is advantageous over the capacitive analog storage device discussed in the Background, in that high speed sampling is possible without a concomitant degradation of signal-to-noise characteristics; such a device is also advantageous over conventional serial-in serial-out (SISO) CCD shift registers in that repeated high-speed serial shifts which induce correspondingly high transfer inefficiency errors are avoided.

I claim:

1. A waveform capture device for sampling a waveform and storing a representation of the sampled waveform, said device comprising:
   timing means for generating a sequence of timing signals at sample times at which it is desired to sample said waveform;
   a plurality of sampling CCD stages, each having
   (1) a source of charge to be transferred and stored,
   (2) a timing gate responsive to said timing signals from said timing means for allowing charge to be transferred from said source,
   (3) a sampling gate interconnected with each other sampling gate and with said waveform, for creating an electrical potential well whose depth is responsive to the magnitude of said waveform at all times, whereby charge transferred from said source will be stored in said potential well in an amount indicative of the magnitude of said waveform at the time said timing gate allows a transfer, and
   (4) a transfer gate for allowing transfer of stored charge out of said sampling potential well; and
   a storage CCD shift register interconnected with said sampling CCD stages for receiving charges transferred from each of said sampling CCD stages and storing said charges for subsequent readout.

2. A device as in claim 1 wherein:
   said timing means comprises a chain of inverting amplifiers, and said sequence of timing signals are derived from the outputs of alternate ones of said inverting amplifiers.

3. A device as in claim 2 wherein:
   a pair of synchronization signals are applied to said inverting amplifiers, said amplifiers being enabled to produce timing signals at the period of the synchronization signals.

* * * * *